United States Patent [19]
Marshall et al.

[11] Patent Number: 5,886,920
[45] Date of Patent: Mar. 23, 1999

[54] VARIABLE CONDUCTING ELEMENT AND METHOD OF PROGRAMMING

[75] Inventors: Daniel S. Marshall, Chandler; Jerald Allen Hallmark, Gilbert; David J. Anderson, Scottsdale; Ellen Lan, Chandler, all of Ariz.

[73] Assignee: Motorola, Inc., Schaumburg, Ill.

[21] Appl. No.: 982,175

[22] Filed: Dec. 1, 1997

[51] Int. Cl.$^6$ .................... G11C 11/22; G11C 11/24
[52] U.S. Cl. ............................. 365/145; 365/149
[58] Field of Search ...................... 365/65, 117, 145, 365/149; 257/295

[56] References Cited

U.S. PATENT DOCUMENTS

| | | | |
|---|---|---|---|
| 2,900,622 | 8/1959 | Rajchman et al. | 365/65 |
| 3,731,163 | 5/1973 | Shuskus | 317/235 R |
| 3,990,057 | 11/1976 | Kumada | 340/173.2 |
| 4,259,728 | 3/1981 | Geary et al. | 365/45 |
| 4,873,455 | 10/1989 | de Chambost et al. | 365/117 |
| 5,262,983 | 11/1993 | Brennan | 365/145 |
| 5,373,462 | 12/1994 | Achard et al. | 365/145 |
| 5,446,688 | 8/1995 | Torimaru | 365/145 |
| 5,515,311 | 5/1996 | Mihara | 365/145 |
| 5,519,812 | 5/1996 | Ishihara | 395/24 |
| 5,541,870 | 7/1996 | Mihara et al. | 365/145 |

OTHER PUBLICATIONS

"Proposal of Adaptive–Learning Neuron Circuits with Ferroelectric Analog–Memory Weights" by Hiroshi Ishiwara, Precision and Intelligence Laboratory, Tokyo Institute of Technology, vol. 32 (1993) pp. 442–446.

*Primary Examiner*—David Nelms
*Assistant Examiner*—Trong Phan
*Attorney, Agent, or Firm*—Rennie William Dover; Robert D. Atkins

[57] ABSTRACT

A variable conducting element (10) and method for programming a constant current or constant resistance provided at output terminals (24 and 26) of a ferroelectric transistor (12). The ferroelectric transistor (12) has portions of a ferroelectric material (32A) programmed having up-polarization states separated by domain walls (34) from portions of a ferroelectric material (32B) programmed having down-polarization states. The portion of the ferroelectric material (32A) programmed in the up-polarization state forms current conduction channels between a source region (23) and a drain region (25) of the ferroelectric transistor (12). The ferroelectric transistor (12) is programmed through a capacitor (14) to adjust the charge supplied to a control terminal (22) of the ferroelectric transistor (12).

11 Claims, 2 Drawing Sheets

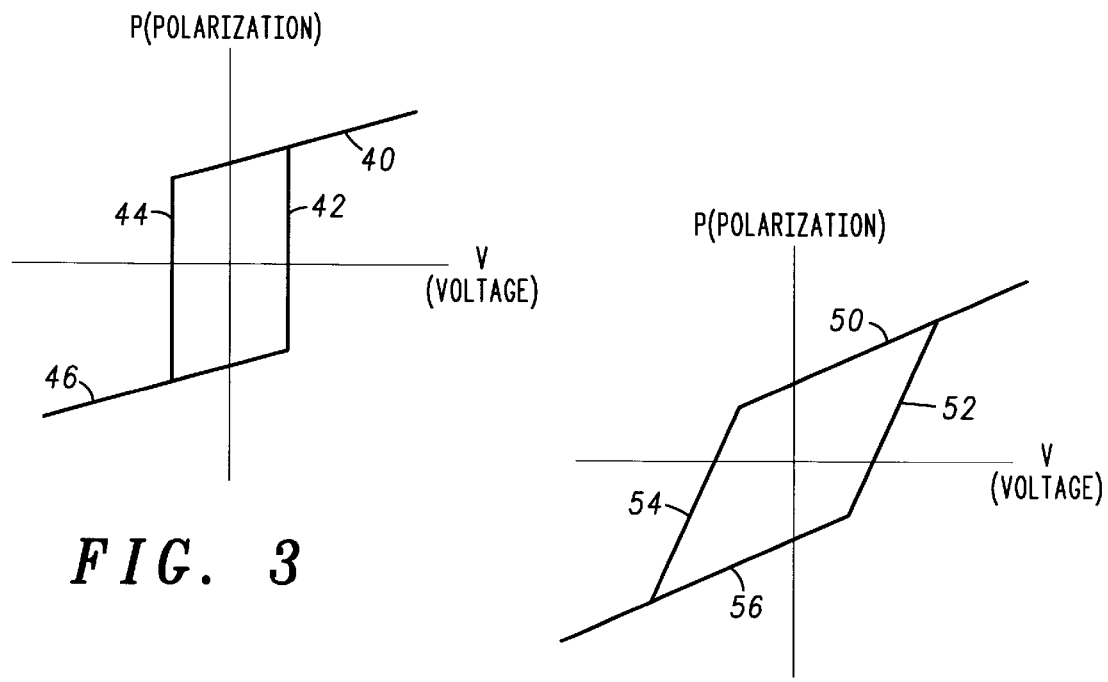
FIG. 3
FIG. 4
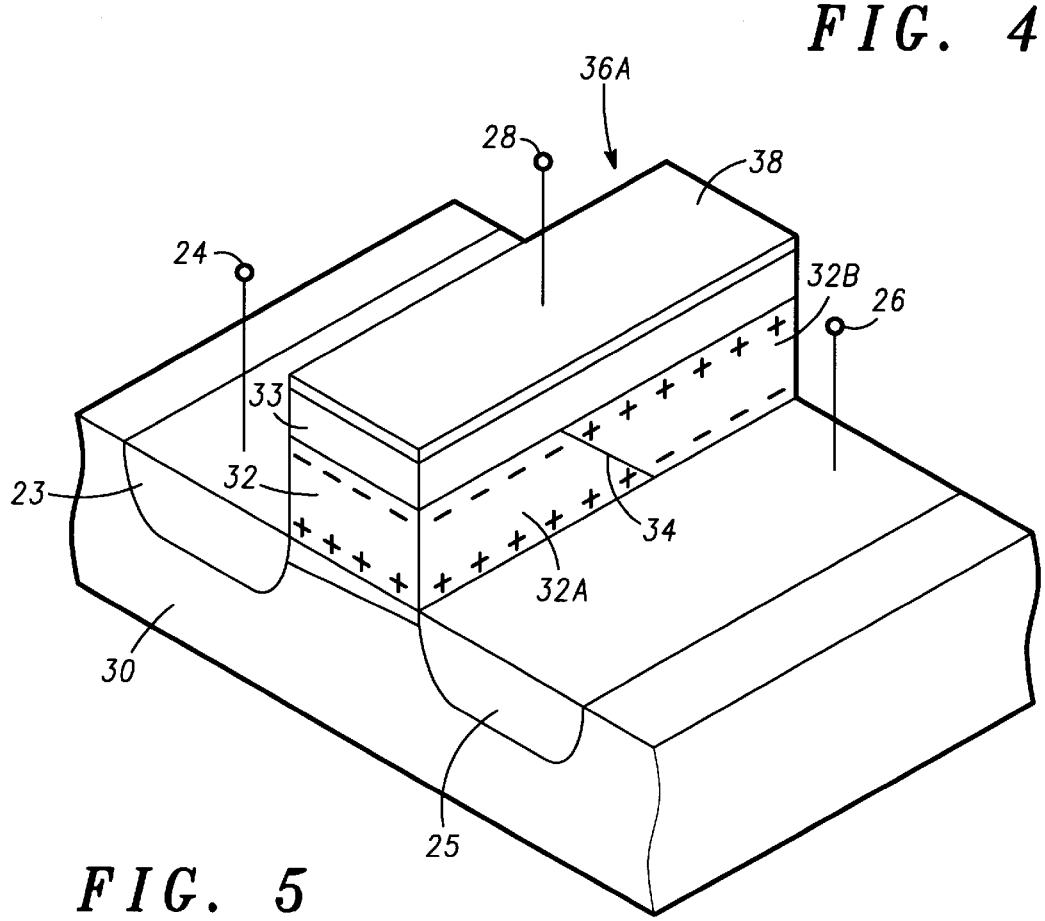
FIG. 5

VARIABLE CONDUCTING ELEMENT AND METHOD OF PROGRAMMING

BACKGROUND OF THE INVENTION

The present invention relates, in general, to integrated circuits and, more particularly, to programmable integrated circuits.

Some precision applications such as filters, amplifiers, delay circuits, etc. use circuits requiring a constant current. For example, a differential stage of an amplifier is typically coupled to a current mirror stage that requires a constant current. Ideally, under quiescent conditions each device of the current mirror stage conducts equal currents. An offset voltage would produce unequal currents in the current mirror stage. One technique commonly used to reduce an offset voltage of a differential input stage is to change the currents conducted by the current mirror stage under quiescent conditions to be equal. Accordingly, current sources have been used to steer supply currents to, or away from, the differential transistor pair in such a way that the sum of the operating currents for the input transistor pair is largely constant.

An offset voltage of an amplifier results from device mismatches of an input differential transistor pair due to wafer process variations in fabricating the devices. An offset voltage is amplified by an amplifier when placed in a gain configuration, producing a DC voltage at an output of the amplifier that reduces performance of the differential amplifier. One consequence of voltage offset in a differential input stage is to reduce the dynamic output range for low voltage amplifiers.

Other applications such as delay circuits or filters use analog integrated circuits having resistor-capacitor (RC) components tuned to provide a desired time delay. Typically, the resistor used in the time delay RC component is implemented using a Metal Oxide Semiconductor Field Effect Transistor (MOSFET) operated in the triode or linear resistance region. This is accomplished by applying an analog voltage to the gate of the MOSFET. Typically, time constants of the associated circuitry do not match because they are dependent on the physical layout of the filter RC components as well as the processes used to manufacture the filter and time delay components.

Accordingly, it would be advantageous to have a device that conducts a constant current. In addition, it is desirable that the device be programmable to account for temperature and voltage changes that affect the constant current.

BRIEF DESCRIPTION OF THE DRAWINGS

FIG. 3 is a plot of polarization versus voltage illustrating the shift in the threshold voltage of a ferroelectric transistor between one of two stable states in accordance with the present invention;

FIG. 4 is a plot of polarization versus voltage illustrating the effects of programming the ferroelectric transistor of FIG. 1 through a capacitor in accordance with the present invention; and FIG. 5 is an isometric view of the programming capacitor and the ferroelectric programmable transistor of FIG. 1.

DETAILED DESCRIPTION OF THE DRAWINGS

Generally, the present invention provides a programmable constant current device or constant resistance device that can serve in a variety of applications such as filters, time delay circuits, amplifiers, etc. For a ferroelectric transistor, the formation of domain walls in the ferroelectric material causes selected portions of the semiconductor material to form current conduction channels. The location of the domain walls controls the width of the current conduction channels and hence, the current being conducted in the ferroelectric transistor.

Figure 1:
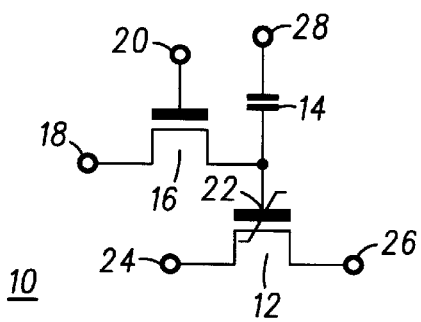
FIG. 1 is a schematic diagram of a variable conducting element having a ferroelectric programmable transistor in accordance with the present invention.

FIG. 1 is a schematic diagram of a variable conducting element 10 in accordance with the present invention. Variable conducting element 10 includes terminals 18, 20, and 28 that are coupled for receiving a control signal $V_{CONT}$, a select signal $V_{SEL}$, and a programming voltage $V_{PROG}$, respectively. In addition, variable conducting element 10 includes terminals 24 and 26 for providing a regulated constant current or resistance. More particularly, a select transistor 16 has a control terminal connected to terminal 20 and a first current carrying terminal connected to terminal 18. A capacitor 14 has a first terminal connected to terminal 28 of variable conducting element 10 and a second terminal connected to a control terminal 22 of a ferroelectric transistor 12. A second current carrying terminal of select transistor 16 is connected to the common connection of control terminal 22 and the second terminal of capacitor 14. The current carrying terminals of ferroelectric transistor 12 are connected to terminals 24 and 26 of variable conducting element 10.

By way of example, select transistor 16 is an N-channel Field Effect Transistor (FET) where the gate terminal serves as the control terminal and the source and drain terminals serve as current carrying terminals. Preferably, ferroelectric transistor 12 is an N-channel FET structure. Although select transistor 16 is shown as an N-channel FET and ferroelectric transistor 12 is shown as an N-channel FET structure, it should be understood this is not a limitation of the present invention. In other words, select transistor 16 can be a P-channel FET and ferroelectric transistor 12 can be a P-channel FET structure. Further, ferroelectric transistor 12 and select transistor 16 can operate as either enhancement mode transistors or depletion mode transistors.

Figure 2:
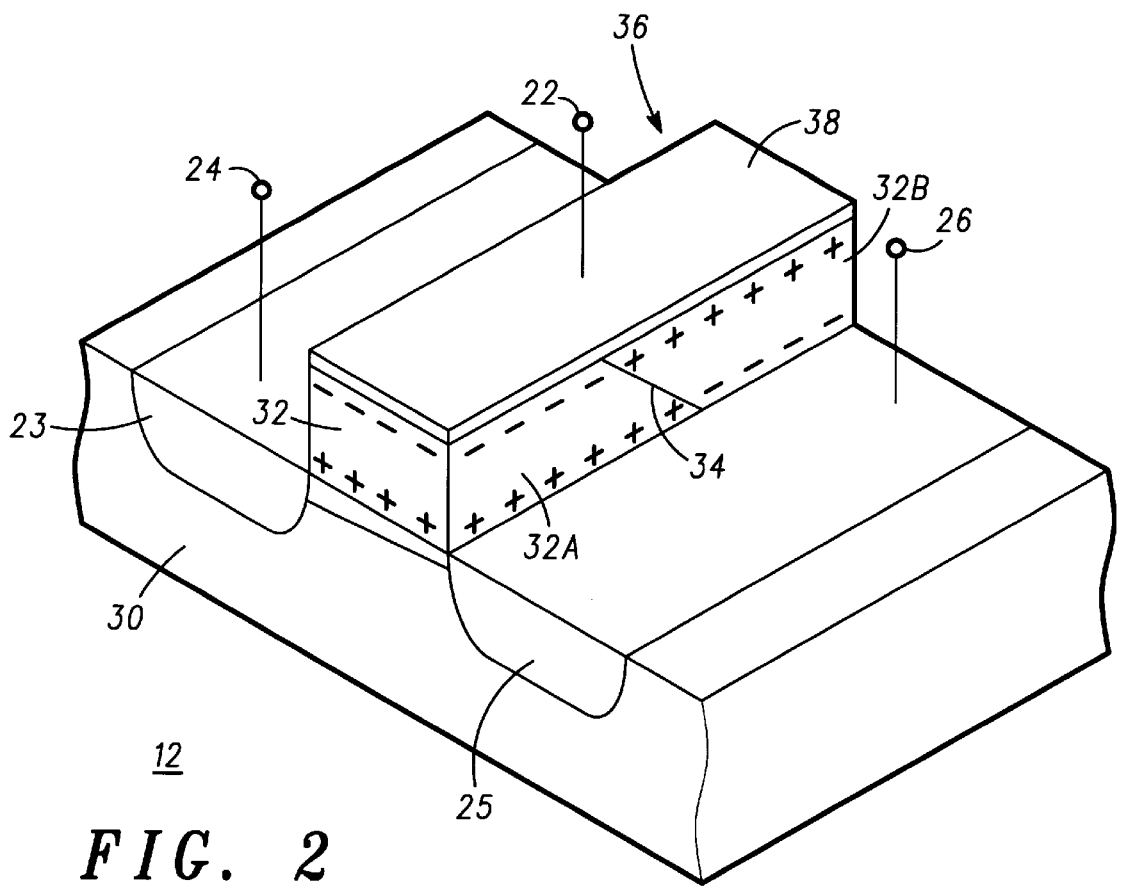
FIG. 2 is an isometric view of the ferroelectric programmable transistor of FIG. 1.

FIG. 2 is a cross sectional view of the programmable ferroelectric transistor 12 of FIG. 1. It should be noted that the same reference numbers are used in the figures to denote the same elements. Ferroelectric transistor 12 is comprised of a semiconductor material 30 having a gate structure 36 formed thereon. In accordance with one embodiment of the present invention, gate structure 36 is comprised of a ferroelectric material 32 and a conductive gate material 38, wherein ferroelectric material 32 is preferably grown on semiconductor material 30. Ferroelectric material 32 serves as a gate dielectric material of ferroelectric transistor 12. In addition, ferroelectric transistor 12 has a source region 23 and a drain region 25. A terminal 24 contacts source region 23, a terminal 26 contacts drain region 25, and a control terminal 22 contacts gate material 38. A bulk or body terminal (not shown) contacts semiconductor material 30.

The threshold voltage, $V_{TH}$, for a non-ferroelectric Metal Oxide Semiconductor Field Effect Transistor (MOSFET) device is determined by the semiconductor material, the type of gate material, the impurities at the interface between the gate dielectric material and the semiconductor material, and the doping concentration of the bulk region of the semiconductor material. In addition, threshold voltage, $V_{TH}$, is dependent on the voltage potential between a source terminal and a bulk terminal. This effect is commonly referred to as body effect.

Ferroelectric material 32 of ferroelectric transistor 12 introduces a shift in the carrier level of the channel that forms between terminals 24 and 26 that affects the threshold voltage, $V_{TH}$. When a voltage supplied at control terminal 22 is above an upper-critical voltage, the ferroelectric material becomes polarized in an up-polarization state. The critical voltage is the voltage at which the polarization of ferroelectric material 32 changes non-linearly and is dependent on the composition and thickness of ferroelectric material 32. The voltage causing ferroelectric material 32 to become polarized in the up-polarization state is referred to as a polarizing voltage. When the voltage supplied to control terminal 22 is below a lower-critical voltage, ferroelectric material 32 becomes polarized in a down-polarization state. The voltage causing ferroelectric material 32 to become polarized in the down-polarization state is referred to as a depolarizing voltage. Voltage values between the polarizing voltage and the depolarizing voltage do not cause the ferroelectric transistor to change state. By way of example, a supply voltage for VDD of about 3 volts requires a polarizing voltage of greater than about 3 volts, i.e., a voltage greater than an upper-critical voltage, for programming ferroelectric transistor 12 in an up-polarization state. A depolarizing voltage of less than about −3 volts is required for programming ferroelectric transistor 12 in a down-polarization state.

FIG. 2 further shows a first portion of ferroelectric material 32A that is programmed in the up-polarization state and a second portion of ferroelectric material 32B that is programmed in the down-polarization state. The letters "A" and "B" have been appended to reference number 32 to indicate that a domain wall 34 has been formed in ferroelectric material 32 and that both an up-polarization state and a down-polarization state are formed in ferroelectric material 32. Domain wall 34 originated in an area of ferroelectric material 32 having nucleation sites. Once formed, domain wall 34 moves under the influence of charge supplied to control terminal 22 caused by a programming voltage supplied at terminal 28. Nucleation sites can be caused at an edge of ferroelectric material 32, from surface roughness, or a defect within ferroelectric material 32. Although domain wall 34 is shown in FIG. 2 as a single domain wall and located approximately in the center of ferroelectric material 32, multiple nucleation sites could cause multiple domain walls 34 to be formed and located anywhere in ferroelectric material 32. It should be noted that neither the number nor the location of domain walls 34 is a limitation of the present invention.

Ferroelectric transistor 12 has a variable conduction channel that is, in part, both caused and controlled by the locations of domain walls 34. For an N-channel ferroelectric FET structure having ferroelectric material 32A programmed in the up-polarization state, a positive charge layer is formed in a portion of ferroelectric material 32A adjacent the interface between ferroelectric material 32A and semiconductor material 30. The positive charge attracts electrons from a bulk portion of semiconductor material 30 to the portion of the semiconductor material between source region 23 and drain region 25. The electrons increase the conduction current between source region 23 and drain region 25 of ferroelectric transistor 12.

On the other hand, when ferroelectric material 32B is programmed in the down-polarization state, negative charge is generated in a portion of the ferroelectric material adjacent the interface between ferroelectric material 32B and semiconductor material 30. The negative charge attracts holes to the surface of semiconductor material 30 that blocks the formation of a conduction channel. Thus, in accordance with the location and the number of domain walls 34 that are formed in ferroelectric material 32, current conduction channels are formed in portions of semiconductor material 30 between source region 23 and drain region 25.

FIG. 3 is a plot of polarization versus voltage illustrating the shift in the threshold voltage of ferroelectric transistor 12, $V_{TH}$, between one of two stable states in accordance with the present invention. The horizontal axis illustrates a voltage supplied at control terminal 22 and the vertical axis illustrates an amount of polarization. By way of example, referring to FIGS. 1, 2 and 3, a positive voltage supplied at control terminal 22 of N-channel ferroelectric transistor 12 sufficient to cause the nucleation of ferroelectric material 32 to occur is represented by line 42. The steepness of line 42 illustrates that an abrupt polarization of ferroelectric material 32 occurs and that ferroelectric transistor 12 is in the up-polarization state, as represented by line 40. Even though the positive voltage supplied at control terminal 22 is removed, ferroelectric transistor 12 remains in the up-polarization state.

A negative voltage supplied at control terminal 22 of N-channel ferroelectric transistor 12 causes the nucleation of ferroelectric material 32 to occur, as represented by line 44. The steepness of line 44 illustrates that an abrupt polarization of ferroelectric material 32 occurs and that ferroelectric transistor 12 is in the down-polarization state, as represented by line 46. Even though the negative voltage supplied at control terminal 22 is removed, ferroelectric transistor 12 remains in the down-polarization state. Thus, two stable states, i.e., the up-polarization state and the down-polarization state, can be formed in ferroelectric transistor 12.

FIG. 4 is a plot of polarization versus voltage illustrating the effects of programming ferroelectric transistor 12 of FIG. 1 through capacitor 14 in accordance with the present invention. The horizontal axis illustrates a voltage supplied at terminal 28 and the vertical axis illustrates an amount of polarization. Briefly referring to FIGS. 1, 2 and 4, a positive voltage applied at terminal 28 of variable conducting element 10 causes a portion of that voltage to appear at terminal 22. It should be noted that the voltage applied at terminal 28 is divided across capacitor 14 and a gate capacitor formed by the dielectric material of ferroelectric transistor 12. It should be further noted that the gate capacitor is formed by gate material 38, ferroelectric material 32, and semiconductor material 30.

A positive voltage applied at terminal 28 of variable conducting element 10 that is sufficient to cause the nucleation of a domain in ferroelectric material 32 is illustrated by line 52. Note that the slope of line 52 is not as steep as that of line 42 in FIG. 3. Thus, supplying a positive programming voltage at terminal 28 allows a stable bias operating point on line 52. In other words, ferroelectric transistor 12 does not abruptly change to the up-polarization state, as represented by line 50.

A negative voltage applied at terminal 28 of variable conducting element 10 that is sufficient to cause the nucleation of a domain in ferroelectric material 32 is illustrated by line 54. Note that the slope of line 54 is not as steep as line 44 in FIG. 3. Thus, supplying a negative programming voltage at terminal 28 allows a stable bias operating point for ferroelectric transistor 12 on line 54. In other words, ferroelectric transistor 12 does not abruptly change to the down-polarization state, as represented by line 56 (FIG. 4). In other words, domain walls 34 that are present in ferroelectric material 32 separate portions of ferroelectric material 32A that are polarized in the up-polarization state and portions of ferroelectric material 32B that are polarized in the down-polarization state. Thus, both the up-polarization state and the down-polarization state can simultaneously exist in ferroelectric material 32.

For a typical FET, the current being conducted in the channel formed between the source and drain regions is proportional to the geometric width and length measurements of the channel that is formed. For ferroelectric transistor 12, the current being conducted in the channel is proportional to both the channel geometric width and length measurements as well as the proportion of the channel that is programmed in the up-polarization state. Thus, the current being conducted between source region 23 and drain region 25 is programmed by positive and negative voltages supplied at terminal 28.

In operation, ferroelectric transistor 12 is programmed to conduct a particular current between terminals 24 and 26 by supplying a programming signal $V_{PROG}$ at terminal 28. Once ferroelectric transistor 12 has been programmed, the programming signal $V_{PROG}$ can be removed and the polarization states of ferroelectric transistor 12 maintained by ferroelectric material 32. Alternatively, a select signal $V_{SEL}$ supplied to terminal 20 enables select transistor 16 for transferring a portion of the programming charge, i.e., a steady state value, to the gate of ferroelectric transistor 12. Following the step of deselecting select transistor 16, another portion of the programming charge is supplied from terminal 28 so that both portions combine to program ferroelectric transistor 12. Thus, the combined charge at control terminal 22 results from the programming signal supplied at terminal 28 passing a charge to capacitor 14 that is added to the charge supplied through select transistor 16.

By way of example, the programming signal $V_{PROG}$ consists of a series of pulses. Each pulse supplied at terminal 28 transfers charge to control terminal 22 of ferroelectric transistor 12 in accordance with a ratio of the capacitance value of capacitor 14 to the capacitance value attributed to gate structure 36 of ferroelectric transistor 12. Thus, the charge at terminal 28 is dependent upon a series of pulses each having a set amplitude and frequency. Alternatively, each pulse could have a different amplitude and would transfer differing amounts of charge to control terminal 22 of ferroelectric transistor 12.

In accordance with another example, the programming signal $V_{PROG}$ supplied at terminal 28 consists of pulses having a variable height such as, for example, a ramped voltage. The ramped voltage would have an initial value of about zero volts and increase in value until reaching a value of about +VDD. Alternatively, the ramped voltage could have an initial value of about +VDD and decrease in value until reaching a value of about zero. Changes in the voltage of signal $V_{PROG}$ cause charge to accumulate at control terminal 22. An accumulated charge sufficient for causing nucleation of a domain in ferroelectric material 32 programs ferroelectric transistor 12.

Following the programming of ferroelectric transistor 12, the conduction of current between terminals 24 and 26 is controlled by the logic state of the signals $V_{SEL}$ and $V_{CONT}$. A logic one value for the signal $V_{SEL}$ causes select transistor 16 to transfer the signal $V_{CONT}$ to the gate of ferroelectric transistor 12. A logic one value for the signal $V_{CONT}$ causes ferroelectric transistor 12 to conduct a constant current in accordance with the portions of ferroelectric material 32 programmed in the up-polarization state. On the other hand, a logic zero value for the signal $V_{CONT}$ causes ferroelectric transistor 12 to become nonconductive.

FIG. 5 is an isometric view of programming capacitor 14 with ferroelectric transistor 12 of FIG. 1. Capacitor 14 (FIG. 1) is formed above ferroelectric material 32. Gate structure 36A includes a gate material 38, dielectric material 33, and ferroelectric material 32. Contact to gate material 38 is provided by terminal 28. Source region 23 and drain region 25 are formed in semiconductor material 30 adjacent to gate structure 36A. Semiconductor material 30 has a first conductivity type and source region 23 and drain region 25 have a second conductivity type. Terminals 24 and 26 provide contact to respective source region 23 and drain region 25. In accordance with this embodiment, ferroelectric transistor 12 is provided with a signal $V_{CONT}$ and a signal $V_{PROG}$ from terminal 28. In other words, ferroelectric transistor 12 is programmed in the up-polarization state and the down-polarization state by the signal $V_{PROG}$. In addition, ferroelectric transistor 12 is selected to provide a constant current at terminals 24 and 26 by a signal provided at terminal 28.

By now it should be appreciated that a structure and method have been provided for programming ferroelectric transistor 12 to conduct a constant current. The ferroelectric material of the ferroelectric transistor is programmed having up-polarization states separated from down-polarization states by domain walls. The portion of the ferroelectric material programmed in the up-polarization state forms current conduction channels between the source and drain regions and provides the constant current. The portion of the ferroelectric material programmed in the up-polarization state can be adjusted to account for system voltage and temperature changes.

We claim:

1. A variable conducting element, comprising:
   a ferroelectric transistor having a control terminal and first and second current carrying terminals;
   a select transistor having a control terminal coupled for receiving a select signal and first and second current carrying terminals, wherein the first current carrying terminal is coupled for receiving a control signal; and
   a capacitor having a first terminal and a second terminal, wherein the first terminal is coupled for receiving a programming signal and the second terminal is commonly coupled to the control terminal of the ferroelectric transistor and to the second current carrying terminal of the select transistor.

2. The variable conducting element of claim 1, wherein the select transistor is an N-channel field effect transistor.

3. The variable conducting element of claim 1, wherein the ferroelectric transistor is an N-channel field effect transistor structure.

4. The variable conducting element of claim 1, wherein the ferroelectric transistor is a depletion mode transistor.

5. The variable conducting element of claim 1, wherein the select transistor is a depletion mode transistor.

6. A method of programming a variable conducting element, comprising the steps of:
   establishing a direct current (D.C.) voltage on a terminal of a gate capacitor of a ferroelectric transistor;
   providing a pulse signal through a capacitor to the gate capacitor of the ferroelectric transistor to cause a change in voltage on the gate capacitor of the ferroelectric transistor; and
   programming a first portion of a ferroelectric material of the ferroelectric transistor to have an up-polarization state in accordance with the charge transferred to the ferroelectric transistor.

7. The method of claim 6, further comprising the step of providing the D.C. voltage through a transistor to the terminal of the gate capacitor of the ferroelectric transistor.

8. The method of claim 7, further comprising the step of conducting a current in the ferroelectric transistor based on a ratio of the first Dortion of the ferroelectric material of the ferroelectric transistor programmed in the up-polarization state to a second portion of the ferroelectric material programmed in a down-polarization state.

9. A method of programming a ferroelectric transistor, comprising the steps of:

transferring a charge through a conduction path of a transistor to a gate terminal of a ferroelectric transistor, wherein the charge is stored on a gate capacitor of the ferroelectric transistor;

supplying a signal through a capacitor to the gate capacitor of the ferroelectric transistor, wherein the signal alters the charge stored on the gate capacitor of the ferroelectric transistor; and conducting a current in the ferroelectric transistor based on the charge stored on the gate capacitor of the ferroelectric transistor.

10. The method of claim 9, further comprising the step of providing a select signal to a gate terminal of the transistor for selecting the transistor.

11. The method of claim 10, further comprising the step of deselecting the transistor prior to the step of supplying a signal throuah a capacitor to the gate capacitor of the ferroelectric transistor.

* * * * *